(12) United States Patent  
Nowak

(10) Patent No.: US 8,642,453 B2  
(45) Date of Patent: Feb. 4, 2014

(54) SCHOTTKY BARRIER DIODE AND METHOD OF FORMING A SCHOTTKY BARRIER DIODE

(71) Applicant: International Business Machines Corporation, Armonk, NY (US)

(72) Inventor: Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/679,357

(22) Filed: Nov. 16, 2012

(65) Prior Publication Data

US 2013/0072003 A1   Mar. 21, 2013

Related U.S. Application Data

(62) Division of application No. 11/736,599, filed on Apr. 18, 2007, now Pat. No. 8,377,810, and a division of application No. 11/164,214, filed on Nov. 15, 2005, now Pat. No. 7,250,666.

(51) Int. Cl.  
*H01L 21/20* (2006.01)  
*H01L 21/36* (2006.01)

(52) U.S. Cl.  
USPC .................................. 438/479; 257/E21.359

(58) Field of Classification Search  
USPC ......................................................... 438/479  
See application file for complete search history.

(56) References Cited

U.S. PATENT DOCUMENTS

| | | | |
|---|---|---|---|
| 4,485,550 A | 12/1984 | Koeneke et al. | |
| 5,336,637 A | 8/1994 | Nowak | |
| 5,629,544 A | 5/1997 | Voldman et al. | |
| 6,040,610 A | 3/2000 | Noguchi et al. | |
| 6,275,094 B1 | 8/2001 | Cranford, Jr. et al. | |
| 6,353,251 B1 | 3/2002 | Kimura | |
| 6,399,413 B1 | 6/2002 | Krutsick | |
| 6,413,829 B1 | 7/2002 | Yu | |
| 6,509,609 B1 | 1/2003 | Zhang et al. | |
| 6,744,103 B2 | 6/2004 | Snyder | |

(Continued)

OTHER PUBLICATIONS

U.S. Appl. No. 11/164,214, filed Nov. 15, 2005, Office Action Communication, Dated Jun. 30, 2006, 3 pages.

(Continued)

*Primary Examiner* — Matthew Landau  
*Assistant Examiner* — Igwe U Anya  
(74) *Attorney, Agent, or Firm* — Gibb & Riley, LLC; Richard M. Kotulak, Esq.

(57) ABSTRACT

Disclosed is a silicon-on-insulator-based Schottky barrier diode with a low forward voltage that can be manufactured according to standard SOI process flow. An active silicon island is formed using an SOI wafer. One area of the island is heavily-doped with an n-type or p-type dopant, one area is lightly-doped with the same dopant, and an isolation structure is formed on the top surface above a junction between the two areas. A metal silicide region contacts the lightly-doped side of the island forming a Schottky barrier. Another discrete metal silicide region contacts the heavily-doped area of the island forming an electrode to the Schottky barrier (i.e., a Schottky barrier contact). The two metal silicide regions are isolated from each other by the isolation structure. Contacts to each of the discrete metal silicide regions allow a forward and/or a reverse bias to be applied to the Schottky barrier.

19 Claims, 11 Drawing Sheets

(56) References Cited

U.S. PATENT DOCUMENTS

| | | |
|---|---|---|
| 6,750,088 B2 | 6/2004 | Hirashita et al. |
| 6,972,470 B2 * | 12/2005 | Irwin et al. .................. 257/478 |
| 7,183,573 B2 * | 2/2007 | Bryant et al. .................. 257/66 |
| 2001/0024847 A1 * | 9/2001 | Snyder .......................... 438/197 |
| 2002/0020878 A1 | 2/2002 | Kawanaka |
| 2003/0002321 A1 | 1/2003 | Chang |
| 2003/0022474 A1 | 1/2003 | Grover et al. |
| 2004/0014304 A1 | 1/2004 | Bhattacharyya |
| 2004/0262667 A1 | 12/2004 | Bhattacharyya |
| 2005/0037582 A1 | 2/2005 | Dennard et al. |
| 2005/0045969 A1 | 3/2005 | Lee et al. |
| 2005/0077574 A1 | 4/2005 | Mouli |
| 2005/0093033 A1 | 5/2005 | Kinoshita et al. |
| 2005/0099839 A1 | 5/2005 | Bhattacharyya |
| 2005/0104152 A1 | 5/2005 | Snyder et al. |
| 2005/0184406 A1 | 8/2005 | Okada et al. |
| 2005/0194610 A1 | 9/2005 | Souma et al. |
| 2005/0199978 A1 | 9/2005 | Takayama |
| 2006/0038229 A1 | 2/2006 | Tsuchiya et al. |
| 2006/0038239 A1 | 2/2006 | Tsuchiya et al. |
| 2006/0043476 A1 | 3/2006 | Kao |
| 2006/0081930 A1 | 4/2006 | Maegawa et al. |
| 2006/0084232 A1 | 4/2006 | Grupp et al. |
| 2006/0091490 A1 | 5/2006 | Chen et al. |
| 2006/0125019 A1 * | 6/2006 | Levin et al. .................. 257/369 |
| 2006/0125040 A1 | 6/2006 | Levin et al. |
| 2006/0199321 A1 | 9/2006 | Lo et al. |
| 2006/0202254 A1 | 9/2006 | Lai et al. |
| 2006/0275968 A1 * | 12/2006 | Mantl et al. .................. 438/197 |

OTHER PUBLICATIONS

U.S. Appl. No. 11/164,214, filed Nov. 15, 2005, Office Action Communication, Dated Aug. 14, 2006, 8 pages.
U.S. Appl. No. 11/164,214, filed Nov. 15, 2005, Notice of Allowance Communication, Dated Apr. 4, 2007, 6 pages.
U.S. Appl. No. 11/736,599, filed Apr. 18, 2007, Office Action Communication, Dated Aug. 20, 2009, 6 pages.
U.S. Appl. No. 11/736,599, filed Apr. 18, 2007, Office Action Communication, Dated Nov. 24, 2009, 13 pages.
U.S. Appl. No. 11/736,599, filed Apr. 18, 2007, Office Action Communication, Dated Jun. 28, 2010, 12 pages.
U.S. Appl. No. 11/736,599, filed Apr. 18, 2007, Advisory Action Communication, Dated Sep. 16, 2010, 2 pages.
U.S. Appl. No. 11/736,599, filed Apr. 18, 2007, Notice of Allowance Communication, Dated Oct. 9, 2012, 11 pages.

* cited by examiner

SCHOTTKY BARRIER DIODE AND METHOD OF FORMING A SCHOTTKY BARRIER DIODE

CROSS-REFERENCE TO RELATED APPLICATION

This application is a Divisional of U.S. Pat. No. 8,377,810, Issued Feb. 19, 2013, which is a Divisional of U.S. Pat. No. 7,250,666, Issued Jul. 31, 2007, the complete contents of which is incorporated herein by reference.

BACKGROUND OF THE INVENTION

1. Field of the Invention

The invention generally relates to a Schottky barrier diode structure, and, more particularly, to a silicon-on-insulator based Schottky barrier diode structure and method of forming the structure.

2. Description of the Related Art

Back-gate complimentary metal oxide semiconductors (CMOS) devices offer two advantages for 32 nm technology both of which are related to the ability to use the back-gate to set threshold voltage (Vt). The first is that channel doping to set Vt can be reduced or eliminated. Using a back gate to set Vt instead of channel doping reduces Vt fluctuation, which is a severe challenge for the 32 nm integrated circuit technology node. The second is that each individual die can be optimized for Vt depending on measured chip (subthreshold) leakage and performance. This will increase performance, decrease power, and improve the manufacturing window size. Unfortunately a relatively thick back gate dielectric layer is desired in order to minimize additional parasitic capacitance and optimize drive current. This thick back gate dielectric layer results in the need for relatively large voltages required on the back gate to control Vt (up to ~7V). Since on-die voltage supply (Vdd) is expected to be only ~1V, voltage multipliers are necessary. Multipliers using pn junction diodes are standard for voltage multiplication. However, the forward voltage for pn junction diodes is relatively large in silicon (~0.6V), so such pn junction diodes prove to be very ineffective. It would be advantageous to provide a diode with a lower forward voltage, such as a Schottky barrier diode with a forward voltage drop of ~0.3V, that can be manufactured efficiently and economically using currently available silicon-on-insulator (SOI) processing flows.

SUMMARY OF THE INVENTION

In view of the foregoing, disclosed herein are embodiments of a silicon-on-insulator (SOI)-based Schottky barrier diode and the associated methods of forming the diodes.

Each embodiment of the Schottky barrier diode of the invention comprises a silicon island in an insulator. Specifically, isolation structures, and in one embodiment, shallow trench isolation structures are patterned and formed through a silicon layer to a buried oxide layer of a silicon-on-insulator (SOI) wafer to define a perimeter of a silicon island.

The silicon island has a first area, a second area, and a top surface. The first and second areas can run parallel to each other. Alternatively, the structure can have an annular configuration in which the second area is centered within the silicon island and the first area is located in the outer perimeter of the island. The first area of the silicon island is heavily-doped with either a p-type or an n-type dopant at a concentration sufficient to achieve a low intrinsic contact resistance between the metal silicide (to be formed in a subsequent step) and the heavily doped region and the second area of the silicon island is, optionally, lightly-doped with the same p-type or n-type dopant at a lower concentration.

A first metal silicide region contacts the first (heavily-doped) area of the silicon island and extends above the top surface of the island. A second metal silicide region contacts the second (lightly-doped) area of the silicon island and also extends above the top surface. The relative depth of the first and second metal silicon regions compared to the depth of the silicon island is a function of the type of SOI used. For example, metal silicides formed on a silicon island with a depth of greater than 20 nm depth may not extend to the depth of the island. Thus, silicon will remain in the island below the metal silicide. However, metal silicide formed on a silicon island with a depth of less than approximately 20 nm (e.g., a silicon island formed from a sub-20 nm silicon film of a UTSOI wafer) may extend to the depth of the island.

The diode further comprises an isolation structure on the top surface of the silicon island that prevents contact between the two metal silicide regions. This isolation structure is particularly configured to prevent metal silicide formation across the length of the silicon island during a self-aligned metal silicide formation process. Two exemplary isolation structures that can be efficiently and economically formed using currently available silicon-on-insulator (SOI) processing flows are disclosed. The first exemplary isolation structure is a gate structure. As with any conventional gate structure, the gate comprises a gate dielectric layer, a gate conductor and sidewall spacers. The second exemplary isolation structure is insulating pad, e.g., a silicon nitride pad.

The above described structure is a Schottky barrier diode comprising two electrodes. Specifically, the second metal silicide region forms a Schottky barrier contact to the second (lightly-doped) area of the silicon island. The first metal silicide region forms another electrode to the first (heavily-doped) area of the same silicon island. The electrode to the first area can be used to apply a forward bias to the diode. For example, if the silicon island is a p-type silicon island and the first area is heavily-doped (e.g., with boron), then a positive voltage applied to the first metal silicide region will cause holes to be injected into the second (lightly-doped) area of the silicon island. Once the forward voltage limit (of approximately 0.3V for a Schottky barrier diode) is met, electrical resistance falls and current passes through.

A method of forming the Schottky barrier diode of the invention comprises first providing a SOI wafer. A silicon island is formed on the wafer surrounded by an insulator. This can be accomplished by patterning and forming shallow trench isolation structures through a silicon layer to a buried oxide layer of the SOI wafer so as to define the perimeter of the silicon island and leave the top surface of the island exposed.

Optionally, once the silicon island is formed it can be lightly-doped with either a p-type or n-type dopant.

An isolation structure is then formed on the top surface of silicon island above the junction between a first area and a second area of the island such that portions of the top surface of the silicon island on both sides of the isolation structure remain exposed. Note that as mentioned above the first and second areas can run parallel to each other. Alternatively, the structure can have an annular configuration in which the second area is centered within the silicon island and the first area is located in the outer perimeter of the island. This isolation structure is specifically formed so as to prevent metal silicide formation across the length of the silicon island during a subsequent self-aligned metal silicide formation process. The formation of two exemplary isolation structures (e.g., a gate structure or an insulating pad) using currently available silicon-on-insulator (SOI) processing flows is illustrated.

After the isolation structure is formed, one area (i.e., a second area) of the silicon island is masked, while the other area (i.e., a first area) is heavily doped with a p-type dopant or n-type dopant (e.g., the same p-type or n-type dopant used to lightly dope the island) in sufficient concentration to pin the Fermi level of the heavily doped region to the valence band or the conduction band, respectively, to achieve a low intrinsic contact resistance between the metal silicide (to be formed in the next step) and the heavily doped region. In an alternative embodiment the step of introducing heavy doping into the first area can be performed before the isolation structure is fabricated.

A self-aligned metal silicide process is then performed so that two metal silicide regions (i.e., a first and a second metal silicide region) are formed on either area of the isolation structure. The relative depth of these metal silicide regions compared to the depth of the silicon island is a function of the thickness of the silicon film in the SOI wafer used.

The above-described process forms a Schottky barrier diode with two electrodes. Specifically, the second metal silicide region forms a Schottky barrier contact to the second (lightly-doped) side of the silicon island and the first metal silicide region forms another electrode to the first (heavily-doped) area of the same silicon island. The electrode to the first area can be used to apply a forward bias to the diode. For example, if the silicon island is a p-type silicon island and the first area is heavily-doped (e.g., with boron), then a positive voltage applied to the first metal silicide region will cause holes to be injected into the second (lightly-doped) area of the silicon island. Once the forward voltage limit (of approximately 0.3V for a Schottky barrier diode) is met, electrical resistance falls and current passes through.

These and other aspects of embodiments of the invention will be better appreciated and understood when considered in conjunction with the following description and the accompanying drawings. It should be understood, however, that the following description, while indicating embodiments of the invention and numerous specific details thereof, is given by way of illustration and not of limitation. Many changes and modifications may be made within the scope of the embodiments of the invention without departing from the spirit thereof, and the invention includes all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS OF THE INVENTION

Figure 1:
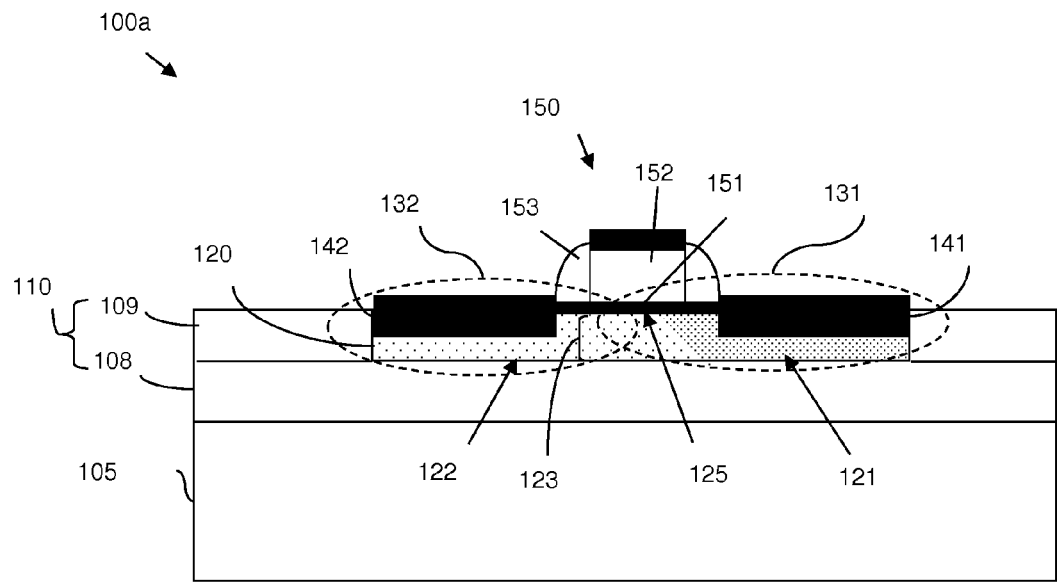
FIG. 1 is a schematic diagram illustrating an embodiment of the Schottky barrier diode of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the invention.

As mentioned above there is need for a diode with low forward voltage that can be manufactured efficiently and economically using current processing flows for 32 nm technologies. Disclosed herein is a silicon-on-insulator based Schottky barrier diode with a low forward voltage of ~0.3V that can be manufactured with little or no additional processing costs. Fabrication follows standard SOI process flow. Specifically, an active silicon island is formed with a heavily-doped (e.g., p+) area, a lightly-doped (e.g., p−) area, and an isolation structure on the top surface above the junction between the two areas. A metal silicide region contacts the lightly-doped area of the island forming a Schottky barrier contact. Another discrete metal silicide region contacts the heavily-doped area of the island forming another electrode. The two metal silicide regions are isolated from each other by the isolation structure. Thus, contacts (i.e., conductor-filled vias) to each of the metal silicide regions allow a forward and/or a reverse bias to be applied to the barrier.

Figure 2:
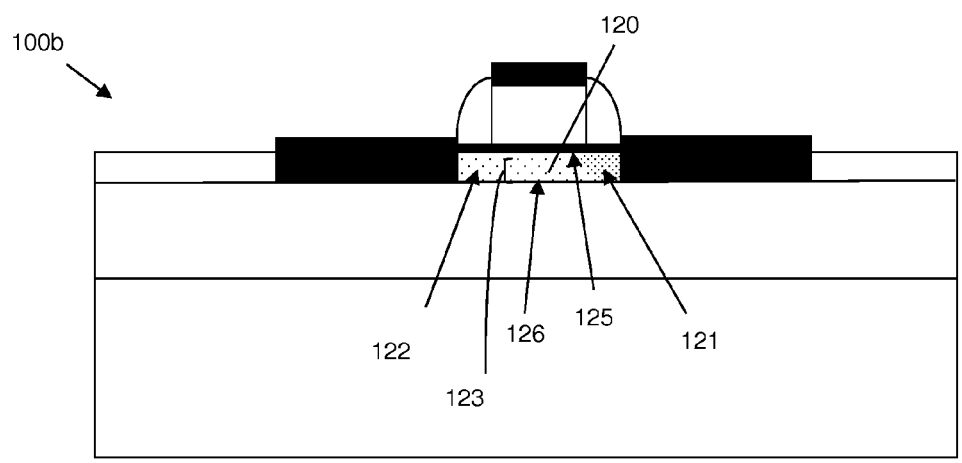
FIG. 2 is a schematic diagram illustrating an embodiment of the Schottky barrier diode of the invention.
Figure 3:
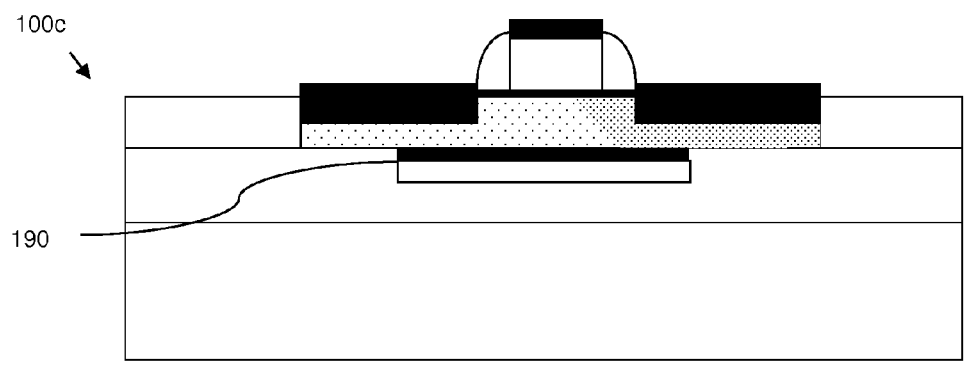
FIG. 3 is a schematic diagram illustrating an embodiment of the Schottky barrier diode of the invention.
Figure 4:
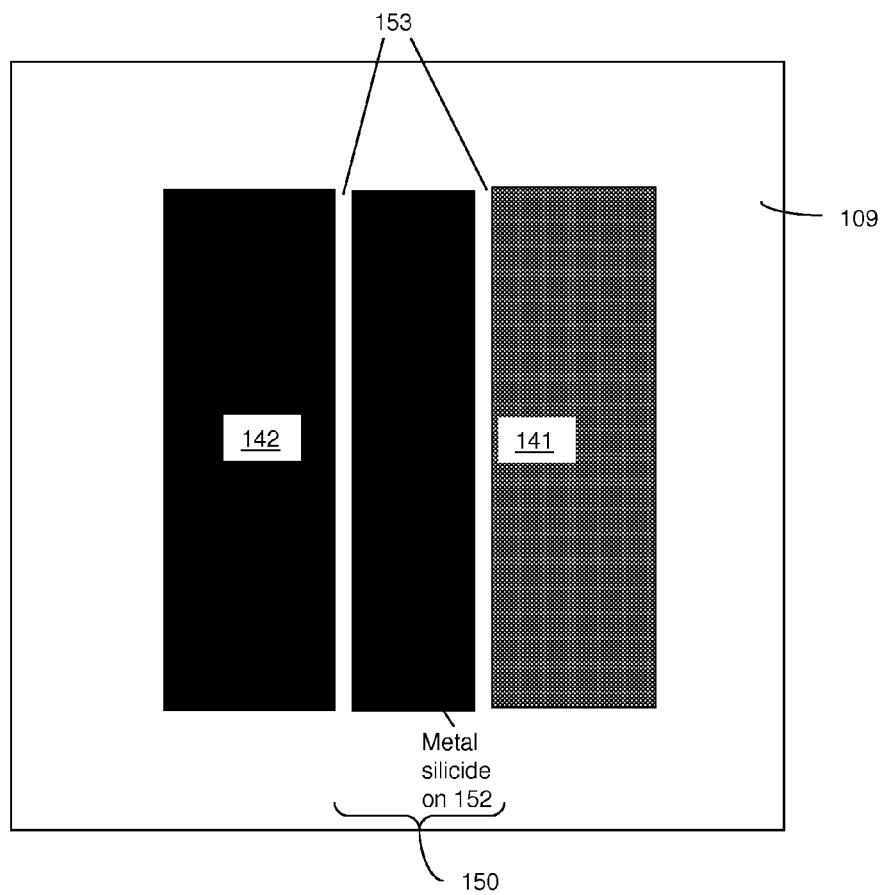
FIG. 4 is a top view illustration of FIGS. 1-3.
Figure 5:
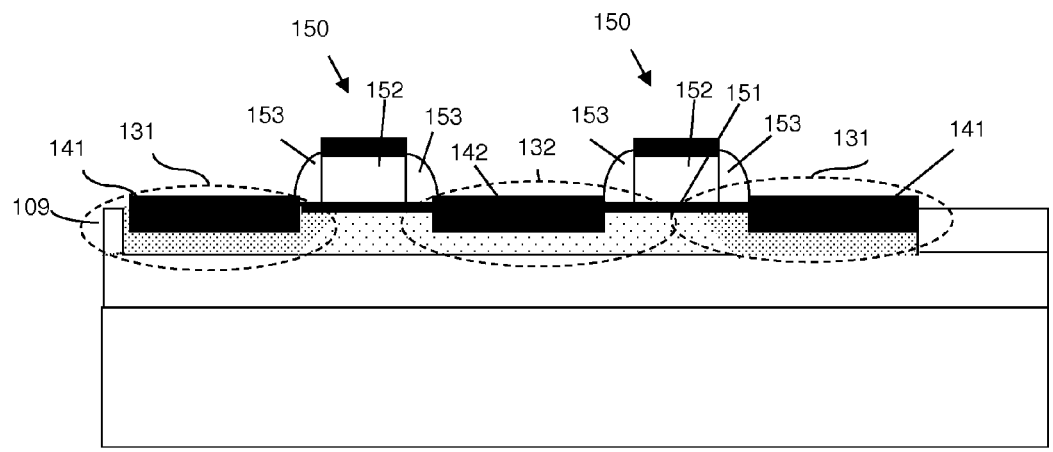
FIG. 5 is a schematic diagram illustrating an embodiment of the Schottky barrier diode of the invention.
Figure 6:
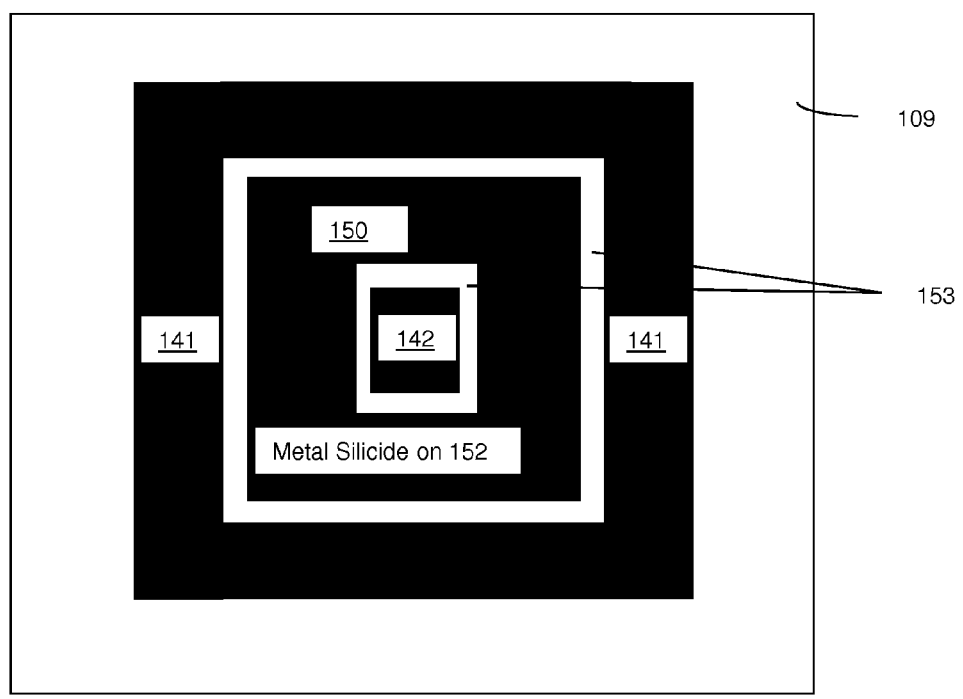
FIG. 6 is a top view illustration of FIG. 5.
Figure 7:
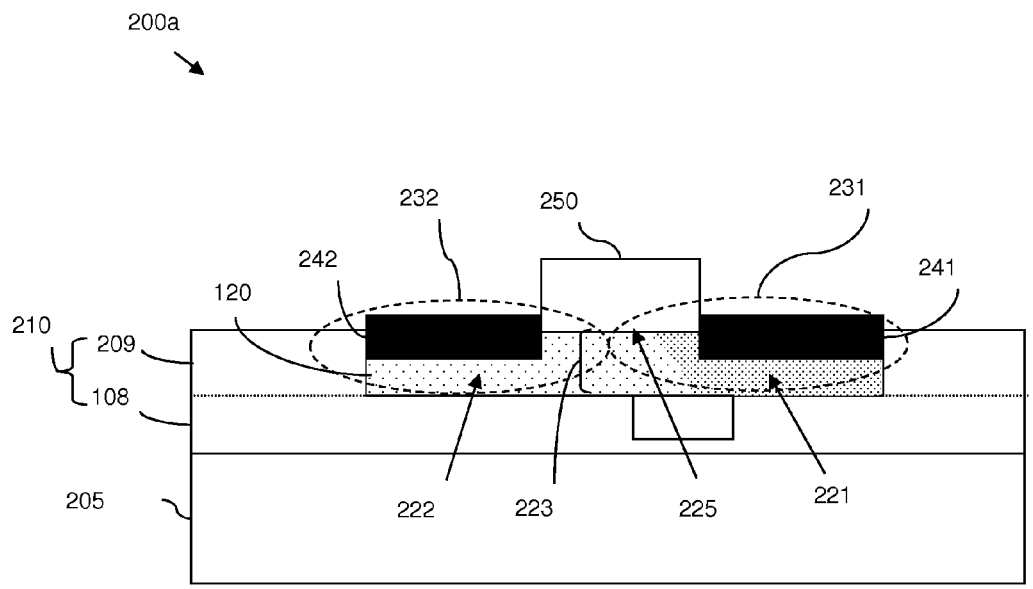
FIG. 7 is a schematic diagram illustrating an embodiment of the Schottky barrier diode of the invention.
Figure 8:
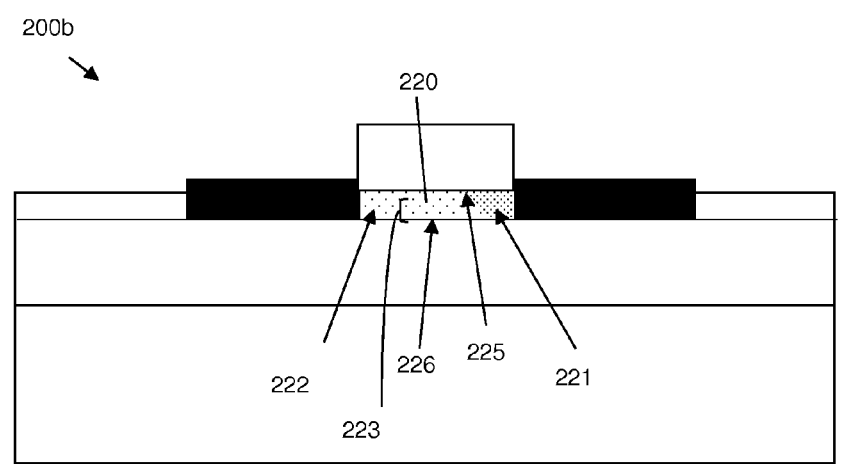
FIG. 8 is a schematic diagram illustrating an embodiment of the Schottky barrier diode of the invention.
Figure 9:
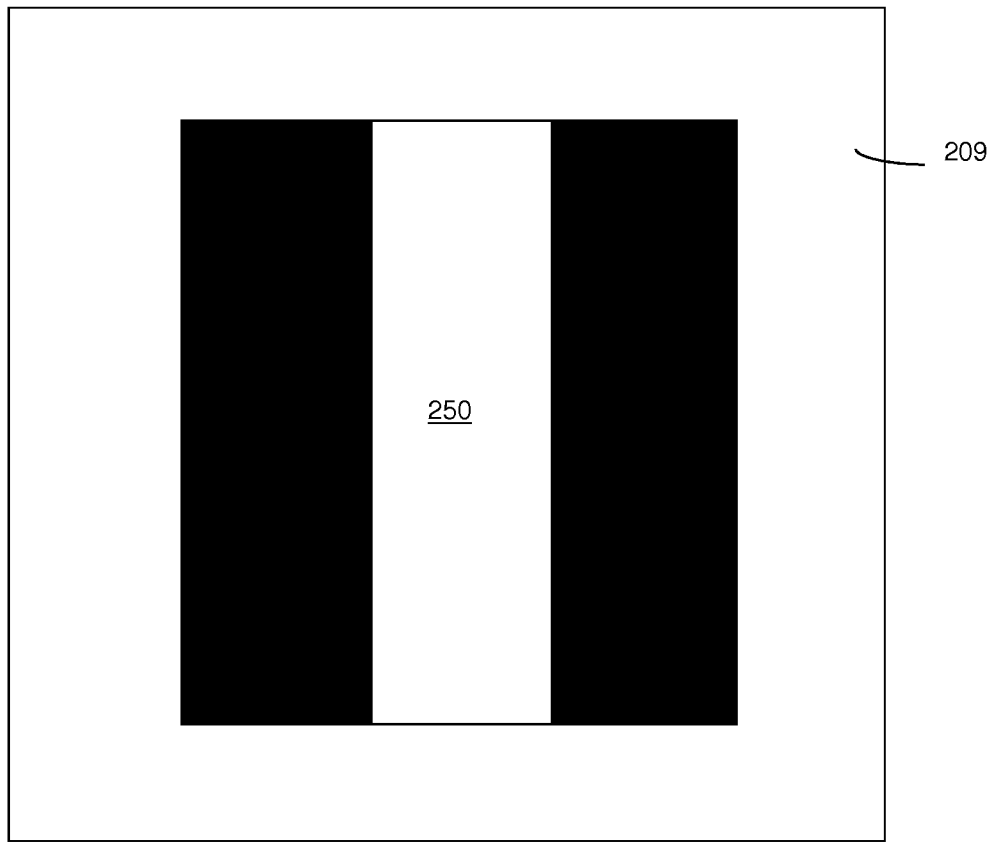
FIG. 9 is a top view illustration of FIGS. 7-8.
Figure 10:
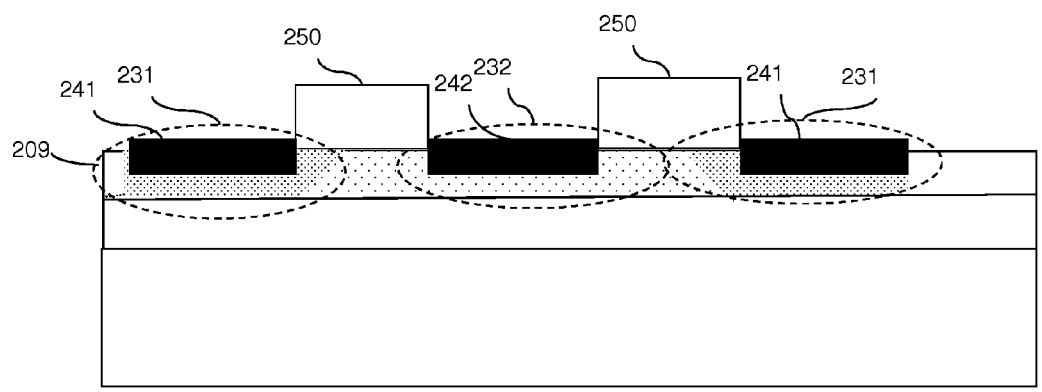
FIG. 10 is a schematic diagram illustrating an embodiment of the Schottky barrier diode of the invention.
Figure 11:
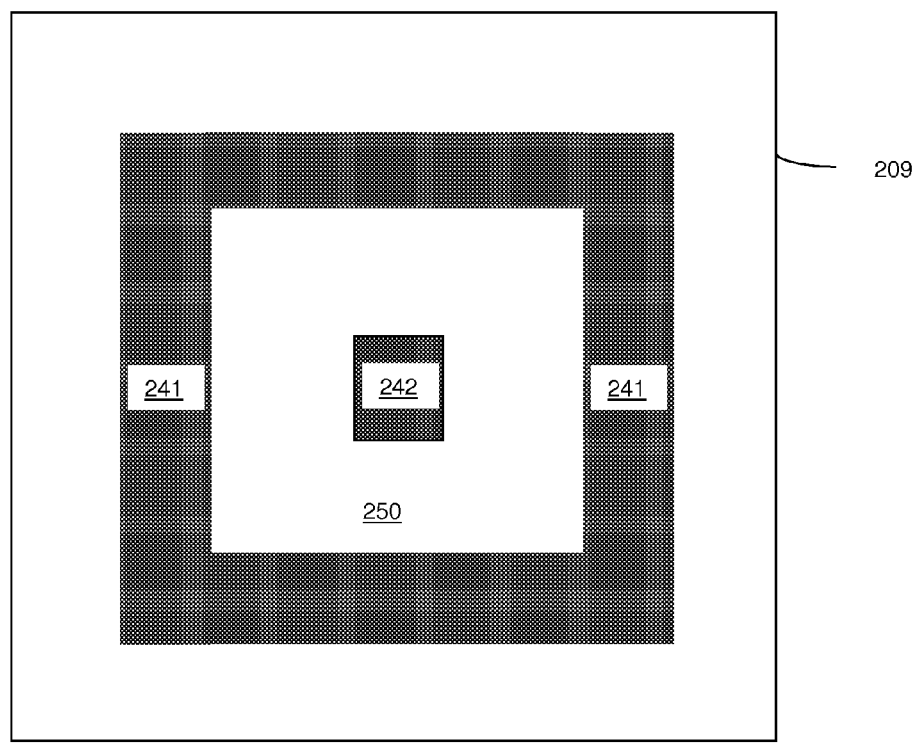
FIG. 11 is a top view illustration of FIG. 10.

Disclosed herein are two embodiments of a silicon-on-insulator (SOI)-based Schottky barrier diode 100 (see FIGS. 1-6) and 200 (see FIGS. 7-11) and the associated methods of forming the diodes. Specifically, FIGS. 1-3 illustrate three variations 100a-100c of one embodiment of the diode 100 of the invention. FIG. 4 illustrates a top view of these three variations. Each variation may have either a parallel configuration, as illustrated in FIGS. 1-4, or alternatively, an annular configuration. For example, FIG. 5 illustrates the diode variation 100a with an annular configuration and FIG. 6 is a top view illustration of FIG. 5. Similarly, FIGS. 7-8 illustrate two variations 200a-200b of another embodiment of the diode 200 of the invention. FIG. 9 illustrates a top view of these two variations. Each variation may have a parallel configuration, as illustrated in FIGS. 7-8, or alternatively, an annular configuration. For example, FIG. 10 illustrates the diode variation 200a with an annular configuration and FIG. 11 is a top view illustration of FIG. 10. The two embodiments 100 and 200 differ only as to the composition of an isolation structure 150 of FIGS. 1-6 and 250 of FIGS. 7-11, discussed in greater detail below.

Therefore, simultaneously referring to FIGS. 1-11, each embodiment of the diode 100 and 200, including the different variations with parallel or annular configurations, comprise a silicon island 120, 220 in an insulator 110, 210. The silicon island 120, 220 an be formed using a SOI wafer (e.g., a thin SOI wafer having a sub-micron silicon film, an ultra-thin silicon-on-insulator (UTSOI) wafer having a sub-20 nm silicon film, etc.). Specifically, shallow trench isolation structures 109, 209 can be patterned and formed through the silicon layer (i.e., the silicon film) to an insulator layer 108, 208 (e.g., a buried oxide layer) of the wafer so as to define the silicon island 120, 220 perimeter.

The silicon island 120, 220 has a first area 121, 221, a second area 122, 222, and a top surface 125, 225. As mentioned above, the embodiments of the invention may have either a parallel or an annular configuration. For example, in a parallel configuration, as illustrated in FIGS. 1-3 and FIGS. 7-8, the first area 121, 221 may be parallel to the second area 122, 222. Alternatively, in an annular configuration, e.g., as illustrated in FIGS. 5 and 10, the second area 122, 222 may be centered within the silicon island and the first area 121, 221 may be in the island perimeter such that it encircles the second area.

The first area 121, 221 of the silicon island 120, 220 is heavily-doped with either a p-type dopant (e.g., boron) or an n-type dopant (e.g., phosphorus, arsenic, or antimony) in sufficient concentrations to achieve a low intrinsic contact resistance between the metal silicide (to be formed in the next step) and the heavily doped region. For example, the first area 121, 221 may be doped with boron at a concentration between approximately 2×1019 and 1×1021 atoms/cm3 in order to achieve a conductive p-type film. The second area 122, 222 of the silicon island is, optionally, lightly-doped with the same p-type or n-type dopant. For example, the second area 122, 222 may be doped with boron at a concentration between approximately 1×1015 and 1×1018 atoms/cm3.

A first metal silicide region 141, 241 contacts the first area 121, 221 of the silicon island 120, 220 and extends above the top surface 125, 225 of the well. A second metal silicide region 142, 242 contacts the second area 122, 222 of the silicon island 120, 220 and also extends above the top surface 125, 225. The relative depth of the first and second metal silicon regions compared to the depth 123, 223 of the silicon island 120, 220 is a function of the type of SOI used. For example, referring to the diodes 100a of FIG. 1 and 200a of FIG. 7, metal silicide formation on a silicon island 120, 220 with a depth of greater than 20 nm depth may not consume the silicon through to the depth 123, 223 of the well. Thus, silicon will remain in the island 120, 220 below the metal silicide regions 141, 142, 241, 242. However, referring to the diodes 100b of FIG. 2 and 200b of FIG. 8, metal silicide formation on a silicon island 120, 220 with a depth 123, 223 of less than approximately 20 nm (e.g., a silicon island formed from a sub-20 nm silicon film of a UTSOI wafer) may consume the silicon to the island depth 123, 223 such that that the metal silicide regions 141, 142, 241, 242 extend from the bottom surface 126, 226 of the island 120, 220 above the top surface 125, 225.

Additionally, the diodes 100a-c and 200a-b of each embodiment further comprise an isolation structure 150, 250 on the top surface 125, 225 of the silicon island between the first metal silicide region 141, 241 and the second metal silicide region 142, 242, thereby, preventing contact between the two metal silicide regions. This isolation structure 150, 250 is particularly configured to prevent metal silicide formation across the length of the silicon island during a self-aligned metal silicide formation process. The embodiments 100 of FIGS. 1, 2, 3, and 5 and 200 of FIGS. 7, 8 and 10 illustrate two different exemplary isolation structures 150, 250 that can be efficiently and economically formed using currently available silicon-on-insulator (SOI) processing flows.

Referring to FIGS. 1, 2, 3 and FIG. 5, the first isolation structure 150 is a gate structure with sidewall spacers. As with conventional SOI gate structures, the gate can comprise a gate dielectric layer 151 (e.g., a silicon oxide layer), a gate conductor 152 (e.g., a metal or polysilicon conductor) and sidewall spacers 153 (e.g., oxide or nitride spacers).

Referring to FIGS. 7, 8 and 10, the second isolation structure 250 can comprise an insulating pad, e.g., a silicon nitride pad.

FIG. 3 further illustrates a back gate 190 feature which may be incorporated into the diode structure 100. Back gate 190 can provide for improved electrical isolation of the space-charge region (the region between the heavily doped silicon and the Schottky barrier contact) and electrostatically shields this space-charge region from possible charge collection in the buried oxide below the device.

Thus, the structure comprises two electrodes: (1) one electrode 132, 232 comprises the silicide 142, 242 that contacts the lightly-doped second area 122, 222 and, thus, forms a Schottky barrier contact to the lightly-doped area 122, 222 and (2) another electrode 131, 231 comprises the silicide 141, 241 that contacts the heavily-doped first area 121, 221. The electrode 131, 231 that contacts the first area can be used to apply a forward bias to the diode. For example, if the silicon island 120, 220 is a p-type silicon island and the first area 121, 221 is heavily-doped (e.g., with boron) such that a low intrinsic contact resistance between the metal silicide and the heavily doped region is formed, then a positive voltage applied to the first metal silicide region will cause holes to be injected into the second (lightly-doped) area 122, 222 of the silicon island. Once the forward voltage limit (of approximately 0.3V for a Schottky barrier diode) is met, electrical resistance falls and current passes through.

Figure 12:
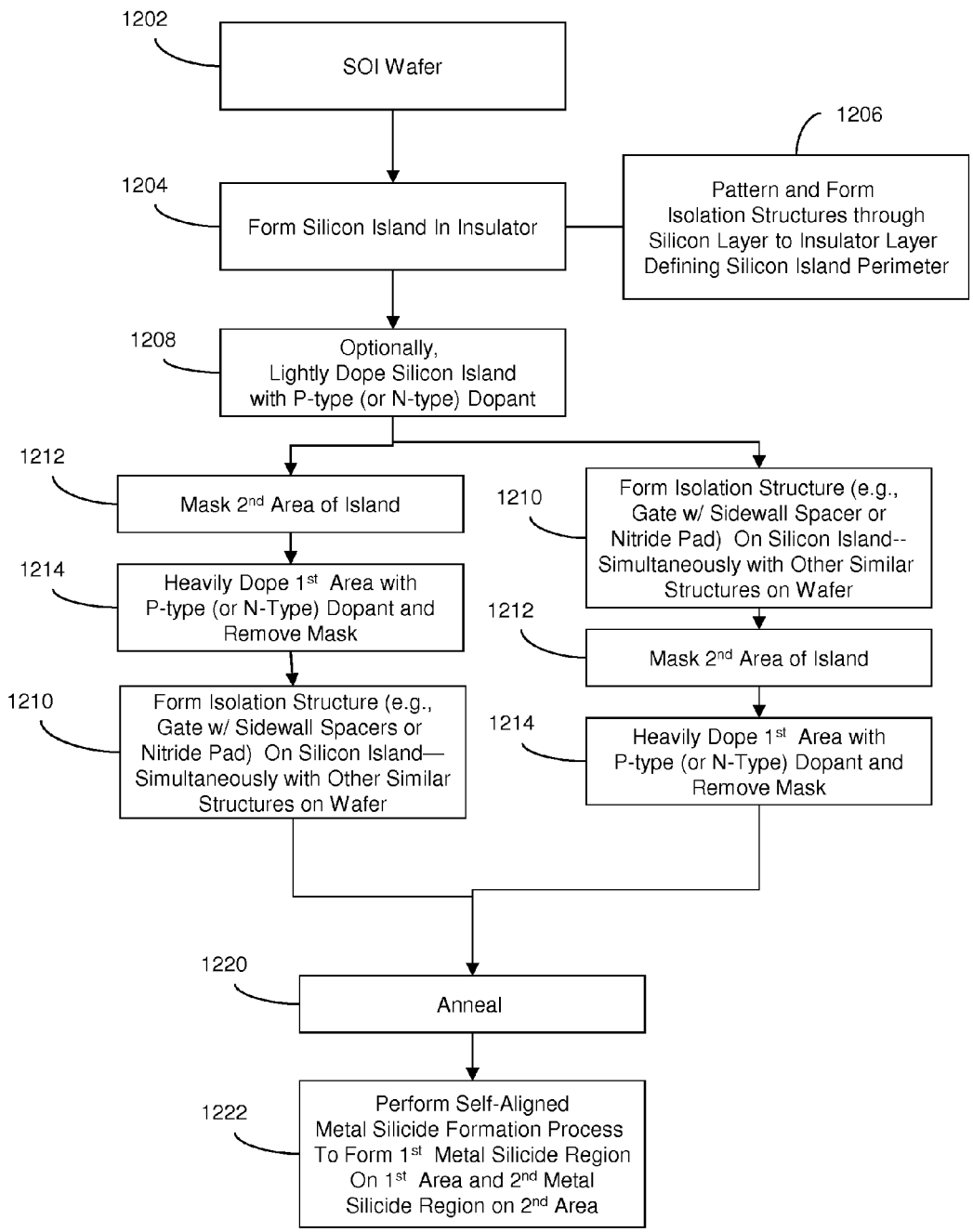
FIG. 12 is a schematic flow diagram illustrating a method forming the Schottky barrier diode of the invention.
Figure 13:
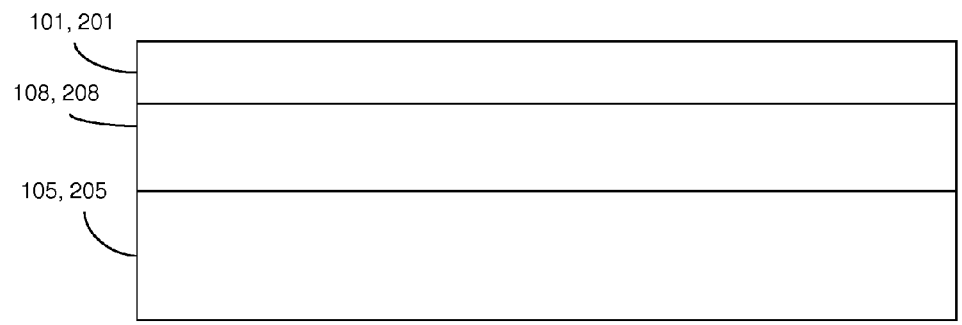
FIGS. 13-19 are schematic diagrams illustrating partially completed Schottky barrier diodes of the invention.
Figure 14:
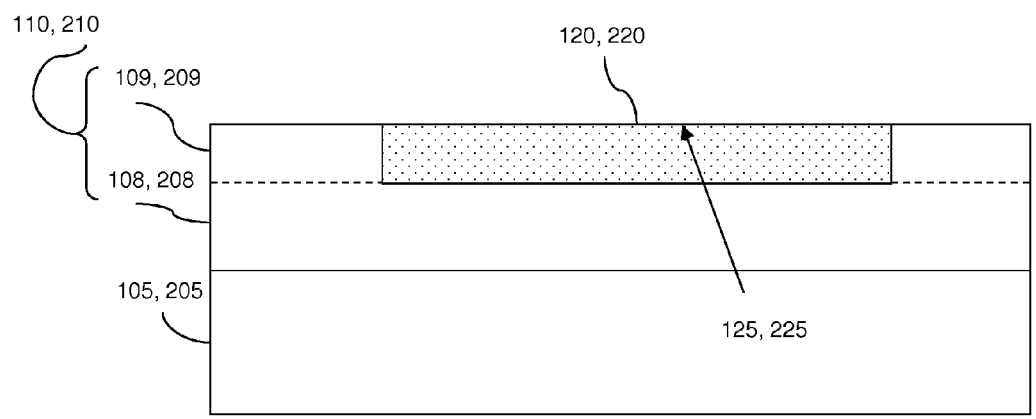

Referring to FIG. 12, the Schottky barrier diodes 100 of FIGS. 1-2 and 5 and 200 of FIGS. 7-8 and 10, described above, can each be formed by first providing a SOI wafer (e.g., a thin SOI wafer having a sub-micron silicon film, an UTSOI wafer having a sub-20 nm silicon film, etc.) (1202, see FIG. 13). Specifically, the SOI wafer can comprise an active silicon layer 101, 201 (i.e., the silicon film), an insulator layer 108, 208 (e.g., a buried oxide layer), and a silicon substrate 105, 205. A silicon island 120, 220 is formed on the wafer and, particularly, formed in an insulator 110, 210 on the wafer (1204), e.g., by patterning and forming shallow trench isolation structures 109, 209 through the silicon layer 101, 201 to the insulator layer 108, 208 so as to define a perimeter of the silicon island 120, 220, leaving the top surface 125, 225 of the island exposed (1206, see FIG. 14).

Optionally, once the silicon island 120, 220 is formed it can be lightly-doped with either a p-type or n-type dopant. For example, it can be doped with a p-type dopant, such as boron, at a concentration between approximately 1×1015 and 1×1018 atoms/cm3 (1208).

Once the silicon island is formed (at process 1204) and, optionally, lightly doped (at process 1208), subsequent processes include masking an area of the island (i.e., a second area and heavily doping another area of the island (i.e., a first area) (1212-1214) as well as forming an isolation structure (e.g., either a gate w/ sidewall spacers or a dielectric pad) on the silicon island (1210). As illustrated in FIG. 12, the order of processes 1212-1214 and process 1210 may vary.

For example, after optionally lightly doping the silicon island (at process 1208) and before masking the second area and heavily doping the first area (at processes 1212-1214), the isolation structure 150, 250 can be formed on the top surface 125, 225 of the silicon island 120, 220 such that on opposing sides of the isolation structure portions of the top surface of the silicon island remain exposed (1210). This isolation structure is specifically formed at process 1210 so as to prevent metal silicide formation across the length of the silicon island during a subsequent self-aligned metal silicide formation process (see process 1222 discussed below). The formation of two exemplary isolation structures (150 of FIGS. 1, 2 and 5 and 250 of FIGS. 7, 8 and 10) using currently available silicon-on-insulator (SOI) processing flows is illustrated.

Figure 15:
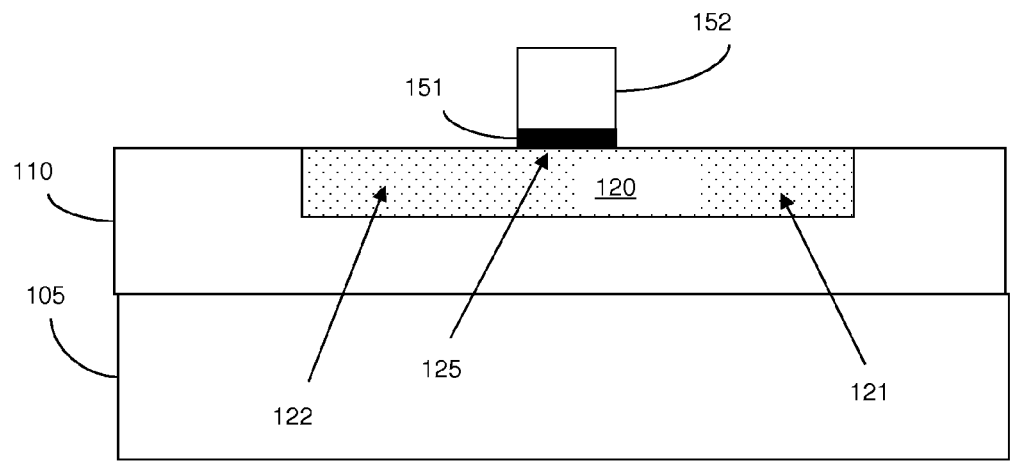
Figure 16:
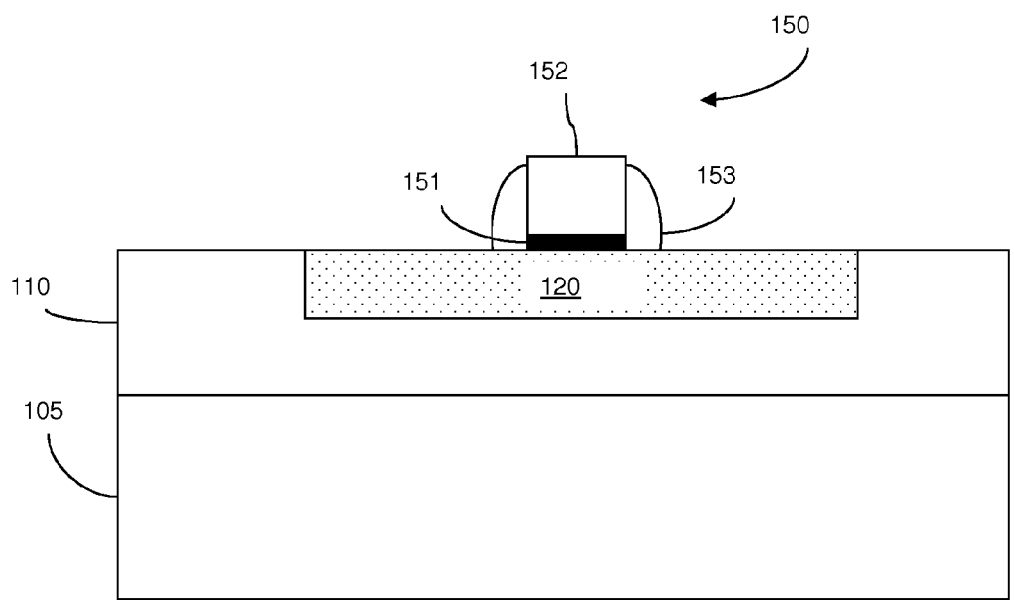
Figure 17:
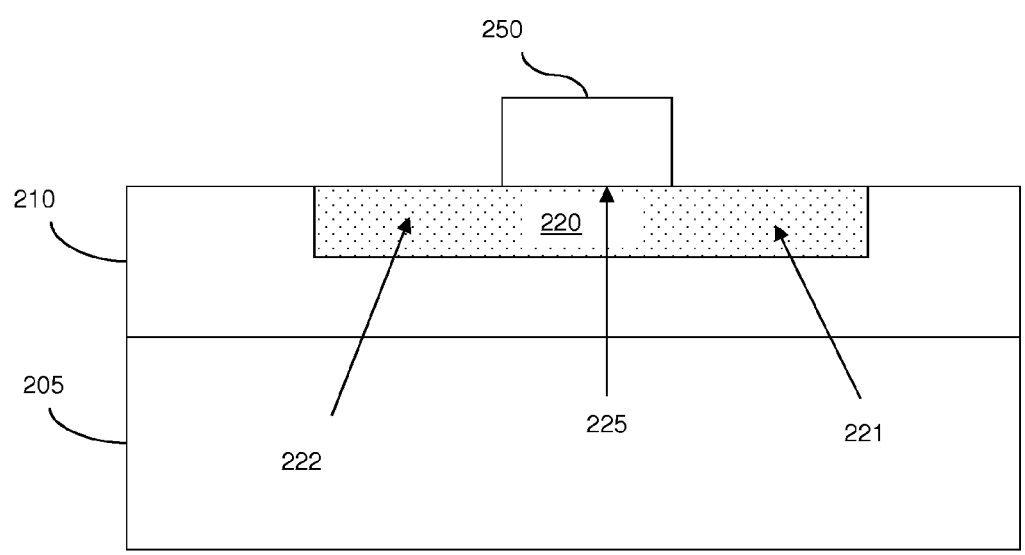

Specifically, the isolation structure 150 of FIGS. 1, 2 and 5 can be formed at process 1210 as a gate with sidewall spacers. This gate can be formed simultaneously with the formation of other gate structures on the wafer. For example, referring to FIG. 15, a gate stack (i.e., a gate dielectric layer 151, such as a silicon dioxide, and a gate conductor layer 152, such as a metal or polysilicon layer) can be formed on the wafer and, particularly, over the top surface 125 of the silicon island 120. The gate stack can be patterned (e.g., using known lithographic techniques) such that it is positioned above the junction between the first 121 and second 122 areas of the island 120 and such that portions of the top surface 125 of the island on both areas remain exposed. Sidewall spacers 153 (e.g., oxide and/or nitride spacers) can then be formed adjacent to the patterned gate stack (see FIG. 16). Alternatively, the isolation structure 250 of FIGS. 7, 8 and 10 can be formed at process 1210 as an insulating pad, e.g., a silicon nitride pad. This insulating pad can be formed simultaneously with the formation of other silicon nitride structures, such as resistors, on the wafer. For example, referring to FIG. 17, a silicon nitride layer can be deposited on the wafer and, particularly, over the top surface 225 of the silicon island 220 and similarly patterned such that it is positioned above the junction between the first 221 and second 222 areas of the island and such that portions of the top surface 225 of the island on both areas remain exposed.

Figure 18:
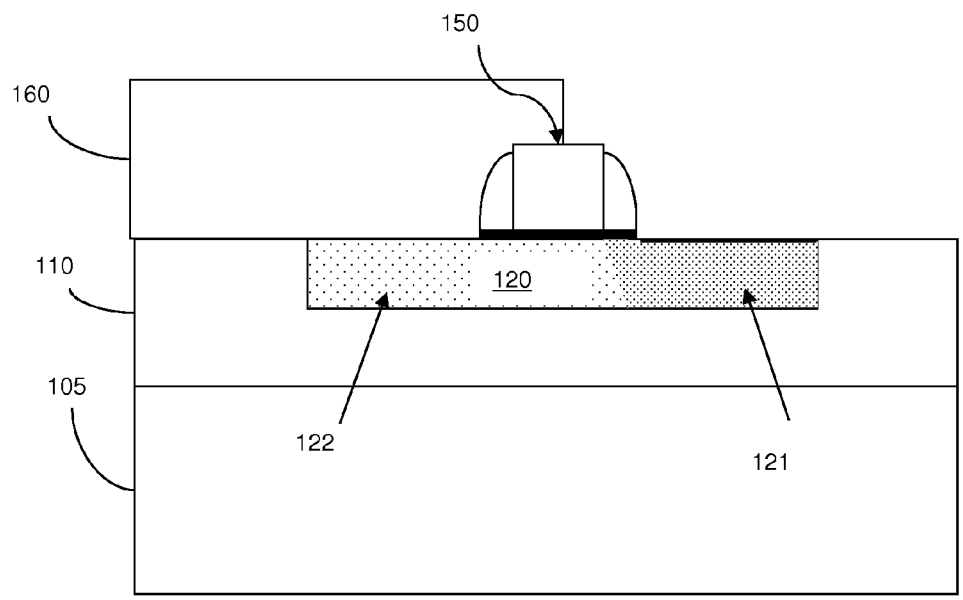
Figure 19:
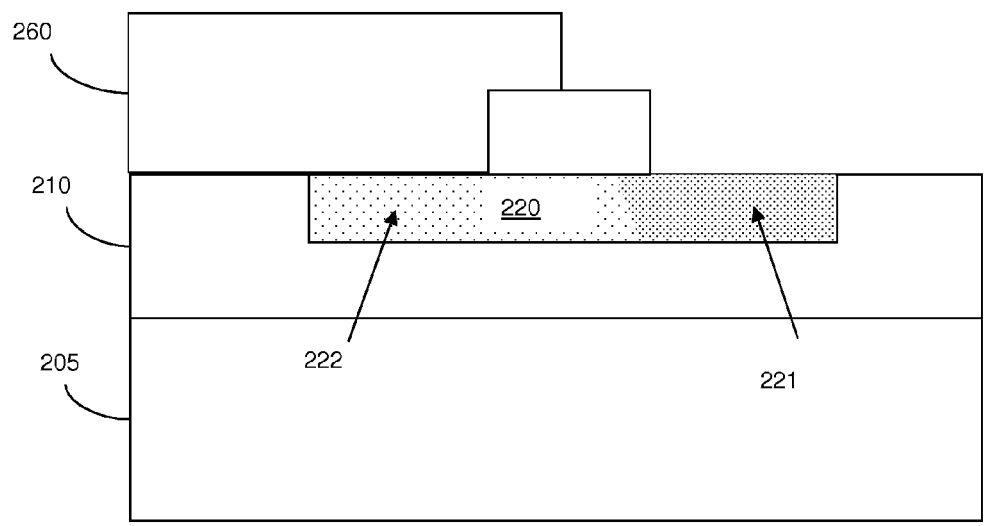

After the isolation structure 150 or 250 is formed, one area (i.e., a second area) of the silicon island can be masked (1212), while another area (i.e., a first area) is heavily-doped with a p-type dopant or n-type dopant (e.g., the same p-type or n-type dopant used to lightly dope the island at process 1208) (1214). Specifically, referring to either FIG. 18 or 19, a mask 160, 260 can be patterned over the first area 122, 222. Then, the first area 121, 221 of the silicon island 120, 220 can be heavily-doped with either a p-type dopant (e.g., boron) or an n-type dopant (e.g., phosphorus, arsenic, or antimony) in sufficient concentrations to pin the Fermi level of this heavily doped region to the valence band or the conduction band so as to achieve a low intrinsic contact resistance between the metal silicide (to be formed in the next step) and the heavily doped region. For example, the first area 121, 221 may be doped with boron at a concentration between approximately $2 \times 10^{19}$ and $1 \times 10^{21}$ atoms/cm3 in order to achieve a conductive p-type film. Those skilled in the art will recognize that, due to the nature of the doping process, dopants will be implanted into the silicon on the first area of the island below the exposed top surface and will also diffuse to some extend beneath the isolation structure. Following the doping process (1214), the mask can be removed and the wafer can be annealed in order to activate the implanted dopants and to repair any implantation damage (1220). For example, a post boron implantation anneal can be carried at approximately 1000° C. for approximately 5 seconds can to avoid dopant redistribution.

As mentioned above, in an alternative embodiment the order for masking the second area and heavily doping the first area (at processes 1212-1214) and forming the isolation structure (at process 1210) may be reversed. Specifically, after lightly doping the silicon island (at process 1208) and before forming the isolation structure (at process 1210), an area (i.e., a second area 122, 222) of the silicon island 120, 220 can be masked (1212) and the first area 121, 221 of the silicon island 120, 220 can be ion-implanted to heavily dope the first area 121, 221 (1214, as described above). The isolation structure 150, 250 may then be fabricated (1210, as described above). In this embodiment, the post-doping anneal (at process 1220), may be performed before or after the formation of the isolation structure.

A metal silicide formation process (e.g., a self-aligned metal silicide process) is then performed (1222) so as to form metal silicide regions 141-142, 241-242 on either side of the isolation structure 150, 250 (see FIGS. 4 and 9). For example, a metal (e.g., Ni, Ti, Co, etc.) can be deposited over the SOI wafer and, particularly, over the exposed top surface of the silicon island and over the isolation structure (e.g., either a gate 150 or a silicon nitride pad 250). The metal is annealed causing a reaction which forms the metal silicide at the silicon/metal junctions. Any unreacted metal and byproducts are removed. Due to the position of isolation structure, there is a break in the metal silicide formation across the silicon island. Specifically, a first metal silicide region 141, 241 is formed adjacent to one side of the isolation structure 150, 250 and contacts the first heavily-doped area 121, 221 of the silicon island. A second metal silicide region 142, 242 is simultaneously formed adjacent to an opposing side of the isolation structure 150, 250 and contacts the second lightly-doped area 122, 222 of the silicon island. Due to the metal silicide formation process, the two metal silicide regions 141-142, 241-242 extend above the top surface of the silicon island and, thus, the isolation structure 150, 250 separates them.

The relative depth of the metal silicide regions 141-142, 241-242 compared to the depth of the silicon island 120, 220 is a function of the type of SOI used. For example, metal silicide formation at process 1222 in a silicon island 120, 220 with a depth of greater than 20 nm depth may not consume the silicon through to that depth. Thus, silicon will remain in the island below the metal silicide (see FIGS. 1 and 7). Metal silicide formation at process 1222 on a silicon island 120, 220 with a depth of less than approximately 20 nm (e.g., a silicon island formed from a sub-20 nm silicon film of a UTSOI wafer) may consume the silicon to that depth such that that the metal silicide region extends from the bottom surface of the island above the top surface (see FIGS. 2 and 8). Those skilled in the art will recognize that the metal silicide formation process is uni-directional so that the metal silicide is formed only at exposed silicon surface and, thus, will not be formed below the isolation structure. However, as mentioned above, the process of doping the first area of the silicon island is not unidirectional in that n-type or p-type dopants will diffuse below the isolation structure on the first area of the silicon island. Thus, even if a UTSOI wafer is used, a heavily-doped portion of the silicon island will remain below the isolation structure.

The above-described processes can be used to form the Schottky barrier diodes 100a-b and 200a-b illustrated in FIGS. 1, 2 and 5 and 7, 8 and 10, respectively. Specifically, the second metal silicide region 142, 242 forms a Schottky barrier contact 132, 232 to the second lightly-doped region 122, 222. Additionally, the first metal silicide region 141, 241 forms another electrode 131, 231 to the first heavily-doped area 121, 221 of the same silicon island. This electrode 131, 231 can be use to apply a forward bias to the diode. For example, if the silicon island 120, 220 is a p-type silicon island and the first area 121, 221 is heavily-doped (e.g., with boron), then a positive voltage applied to the first metal silicide region 141, 241 will cause holes to be injected into the second (lightly-doped) area 122, 222 of the silicon island 120, 220. Once the forward voltage limit (of approximately 0.3V for a Schottky barrier diode) is met, electrical resistance falls and current passes through.

Therefore, disclosed above, is a silicon-on-insulator based Schottky barrier diode with a low forward voltage of ~0.3V that can be manufactured according to standard SOI process flow. An active silicon island is formed using an SOI wafer. One area of the island is heavily-doped with a p-type or n-type dopant, one area is lightly-doped with the same dopant, and an isolation structure is formed on the top surface above the junction between the two areas. A metal silicide region contacts the lightly-doped area of the island forming a Schottky barrier contact. Another discrete metal silicide region contacts the heavily-doped area of the island forming another electrode. The two metal silicide regions are isolated from each other by the isolation structure. Contacts to each of the discrete metal silicide regions allow a forward and/or a reverse bias to be applied to the Schottky barrier.

From this invention flow the benefits of low forward-voltage diodes. In particular, circuit requiring rectification of an alternating current to a unidirection, or DC circuit may be achieved at operating voltages which would otherwise be prohibitive. Specifically voltage pump circuits which can be used to achieve inverted polarity power supplies (i.e. a voltage of the opposite sign of that already available) can be designed to operate at power supply voltages below one volt. Furthermore, many common voltage-multiplier circuits require use of rectifying diodes, and would be inoperable with pn junction diodes below 1V, but through use of the inventive diode described herein can be successfully employed in high-performance SOI CMOS. Applications further include the generation of both positive and negative power supplies on a CMOS chip from a single low voltage (<1V) supply to enable back-gate biases appropriate to advance back-gate CMOS technology.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that the invention can be practiced with modification within the spirit and scope of the appended claims.

What is claimed is:

1. A method of forming a Schottky barrier diode comprising:
    forming a silicon island in an insulator, said silicon island having an exposed top surface, a first area, and a second area;
    forming an isolation structure on said exposed top surface above an interface between said first area and said second area, said isolation structure comprising only an isolation pad patterned from only a single layer of isolation material;
    doping said first area with one of a p-type dopant and an n-type dopant; and
    performing a metal silicide formation process such that a first metal silicide region contacts said first area and extends above said top surface and is positioned laterally immediately adjacent to a first side of said isolation pad and such that a second metal silicide region contacts said second area and extends above said top surface and is positioned laterally immediately adjacent to a second side of said isolation pad opposite said first side,
    said isolation structure separating said first metal silicide region from said second metal silicide region, and
    said second metal silicide region forming a Schottky barrier contact to said second area.

2. The method of claim 1, said silicon island being doped with said one of said p-type dopant and said n-type dopant before said forming of said isolation structure such that, after said doping of said first area, said second area has a lower concentration of said one of said p-type dopant and said n-type dopant as compared to said first area.

3. The method of claim 1, said forming of said isolation structure comprising forming a silicon nitride pad by depositing silicon nitride on said silicon island and patterning said silicon nitride to form said silicon nitride pad simultaneously with other silicon nitride structures.

4. The method of claim 1, said isolation pad having a height relative to said top surface of said silicon island that is greater than heights of said first metal silicide region and said second metal silicide region relative to said top surface of said silicon island.

5. The method of claim 1, said doping of said first area comprising one of doping said first area before said forming of said isolation structure and doping said first area after said forming of said isolation structure.

6. The method of claim 1, said metal silicide formation process being performed such that said first metal silicide region and said second metal silicide extend from a bottom surface of said silicon island to above said top surface of said silicon island.

7. A method of forming a Schottky barrier diode comprising:
    forming a silicon island in an insulator, said silicon island having a bottom surface immediately adjacent to said insulator, an exposed top surface opposite said bottom surface, a first area, and a second area;
    forming an isolation structure on said exposed top surface above an interface between said first area and said second area, said isolation structure comprising only an isolation pad patterned from only a single layer of isolation material;
    doping said first area with one of a p-type dopant and an n-type dopant; and
    performing a metal silicide formation process such that a first metal silicide region extends vertically from said bottom surface to above said top surface and is positioned laterally immediately adjacent to a first side of said isolation pad and such that a second metal silicide region extends from said bottom surface to above said top surface and is positioned laterally immediately adjacent to a second side of said isolation pad opposite said first side,
    said first metal silicide region and said second metal silicide region further each being positioned laterally adjacent and contacting remaining portions of said first area and said second area, respectively, below said isolation structure,
    said isolation structure separating said first metal silicide region from said second metal silicide region, and said second metal silicide region forming a Schottky barrier contact to said second area.

8. The method of claim 7, said silicon island being doped with said one of said p-type dopant and said n-type dopant before said forming of said isolation structure such that, after said doping of said first area, said second area has a lower concentration of said one of said p-type dopant and said n-type dopant as compared to said first area.

9. The method of claim 7, said forming of said isolation structure comprising forming a silicon nitride pad, said forming of said silicon nitride pad comprising depositing only a single layer of silicon nitride on said silicon island and patterning said single layer of silicon nitride to form said silicon nitride pad.

10. The method of claim 9, said silicon nitride pad being formed simultaneously with other silicon nitride structures.

11. The method of claim 7, said isolation pad having a height relative to said top surface of said silicon island that is greater than heights of said first metal silicide region and said second metal silicide region relative to said top surface of said silicon island.

12. The method of claim 7, said doping of said first area comprising one of doping said first area before said forming of said isolation structure and doping said first area after said forming of said isolation structure.

13. The method of claim 7, said silicon island having a depth of less than 20 nm.

14. A method of forming a Schottky barrier diode comprising:
  forming a silicon island in an insulator, said silicon island having a top surface, a first area, and a second area positioned laterally adjacent to said first area;
  forming an isolation structure comprising a silicon nitride pad on said top surface between said first area and said second area;
  doping only said first area at a first side of said isolation structure with one of a p-type dopant and an n-type dopant such that only a first portion of said silicon island below said isolation structure at said first side is doped with said one of said p-type dopant and said n-type dopant; and,
  performing a metal silicide formation process such that, in said first area at said first side of said isolation structure, a first metal silicide region extends from said insulator to above said top surface and is positioned laterally adjacent to said first portion of said silicon island below said isolation structure and such that, in said second area at a second side of said isolation structure opposite said first side, a second metal silicide region extends from said insulator to above said top surface and is positioned laterally adjacent to a second portion of said silicon island below said isolation structure,
  said isolation structure separating said first metal silicide region from said second metal silicide region,
  said second metal silicide region forming a Schottky barrier contact to said second portion of said silicon island below said isolation structure, and
  said silicon island being undoped before said doping of only said first area.

15. The method of claim 14, said silicon nitride pad having a height relative to said top surface of said silicon island that is greater than heights of said first metal silicide region and said second metal silicide region relative to said top surface of said silicon.

16. The method of claim 14, said forming of said isolation structure comprising said silicon nitride pad comprising depositing silicon nitride on said silicon island and patterning said silicon nitride.

17. The method of claim 14, said silicon nitride pad being formed simultaneously with other silicon nitride structures.

18. The method of claim 14, said doping of only said first area comprising one of doping said first area before said forming of said isolation structure and doping said first area after said forming of said isolation structure.

19. The method of claim 14, said first area being annular with respect to said second area.

* * * * *